United States Patent
Delaunay et al.

(10) Patent No.: US 9,178,538 B2
(45) Date of Patent: Nov. 3, 2015

(54) MULTI-STANDARD WIRELESS TRANSMITTER

(75) Inventors: Nicolas Delaunay, Grenoble (FR); Eric Kerherve, Talence (FR); Nathalie Deltimple, Pessac (FR); Didier Belot, Rives (FR)

(73) Assignee: STMicroelectronics SA, Montrouge (FR)

( * ) Notice: Subject to any disclaimer, the term of this patent is extended or adjusted under 35 U.S.C. 154(b) by 728 days.

(21) Appl. No.: 13/300,291

(22) Filed: Nov. 18, 2011

(65) Prior Publication Data
US 2012/0314736 A1 Dec. 13, 2012

(30) Foreign Application Priority Data
Jun. 7, 2011 (FR) .................................... 11 54922

(51) Int. Cl.
| | |
|---|---|
| *H04L 25/49* | (2006.01) |
| *H04B 1/04* | (2006.01) |
| *H03F 1/32* | (2006.01) |
| *H03F 3/24* | (2006.01) |

(52) U.S. Cl.
CPC ............ *H04B 1/0475* (2013.01); *H03F 1/3247* (2013.01); *H03F 1/3294* (2013.01); *H03F 3/24* (2013.01); *H03F 2200/336* (2013.01)

(58) Field of Classification Search
CPC ..... H04L 1/243; H04L 1/0001; H04L 27/368; H04L 25/03343; H03F 1/3247; H04B 3/32
USPC ........................................ 375/221, 296, 285
See application file for complete search history.

(56) References Cited

U.S. PATENT DOCUMENTS

| | | | | |
|---|---|---|---|---|
| 5,903,611 | A * | 5/1999 | Schnabl et al. ................ | 375/297 |
| 7,061,990 | B2 * | 6/2006 | Wright et al. ................. | 375/296 |
| 2001/0033196 | A1 * | 10/2001 | Lennous et al. .............. | 327/552 |
| 2002/0101935 | A1 * | 8/2002 | Wright et al. ................. | 375/295 |
| 2005/0105642 | A1 * | 5/2005 | Muller et al. ................. | 375/296 |
| 2008/0049868 | A1 * | 2/2008 | Brobston ....................... | 375/297 |
| 2009/0264089 | A1 * | 10/2009 | Suzuki et al. ............... | 455/114.3 |
| 2010/0178891 | A1 * | 7/2010 | Wen et al. .................. | 455/226.1 |

OTHER PUBLICATIONS

Sanjay Devkumar and Chandan Kumar Chakrabarty, "Using Lowpass and Highpass filters to Form UWB Bandpass Filter", Aug. 2008, IEEE.*

(Continued)

*Primary Examiner* — Dac Ha
*Assistant Examiner* — Janice Tieu
(74) *Attorney, Agent, or Firm* — Slater & Matsil, LLP

(57) ABSTRACT

The invention concerns a circuit for multi-standard wireless RF transmission comprising: input circuitry (302 to 314) for generating a transmission signal ($I_T(t)$, $Q_T(t)$) based on an input data signal (I, Q); a power amplifier (316) adapted to amplify said transmission signal to provide an output signal (S(t)) for transmission via at least one antenna; and feedback circuitry (320 to 340) comprising at least one variable low-pass filter (334, 336) for generating a feedback signal ($I_{FB}$, $Q_{FB}$) based on said output signal, wherein said input circuitry further comprises pre-distortion circuitry (302) adapted to modify said input data signal (I, Q) based on said feedback signal.

20 Claims, 2 Drawing Sheets

(56) References Cited

OTHER PUBLICATIONS

Lam et al., "A 2.6 GHz/5.2 GHz CMOS Voltage-controlled Oscillator" IEEE International Solid-State Circuits Conference, 1999, pp. 482-484.

Shin, "A CMOS Active-RC Low-Pass Filter with Simultaneously Tunable High- and Low-Cutoff Frequencies for IEEE 802.22 Applications," IEEE Transactions on Circuits and Systems-II, Express Briefs, vol. 57, No. 2, Feb. 2010.

Shahana, et al., "GUI Based Decimation Filter Design Tool for Multi-Standard Wireless Transceivers," IET-UK International Conference on Information and Communication Technology in Electrical Sciences (ICTES), Dr. M.G.R. University, Dec. 20-22, 2007, pp. 600-605.

Sadhwani, et al., "Multi-band Multi-standard Local Oscillator Generation for Direct up/down Conversion Transceiver Architectures Supporting WiFi and WiMax Bands in Standard 45 nm CMOS Process," IEEE Radio Frequency Integrated Circuit Symposium, 2010, pp. 149-152.

* cited by examiner

MULTI-STANDARD WIRELESS TRANSMITTER

This application claims the benefit of French National patent application Ser. No. 11/54922, filed on Jun. 7, 2011, entitled "Multi-standard wireless transmitter," which application is hereby incorporated herein by reference to the fullest extent allowable by law.

TECHNICAL FIELD

The present invention relates to the field of wireless transmission, and in particular to an apparatus and method of multi-standard RF (radio frequency) wireless transmission.

BACKGROUND

FIG. 1 illustrates a mobile device 100, which is for example capable of communicating according to a number of different communication standards via one of a number of mobile network masts 102, 104, 106 and 108. For example, different regions may comprise communication infrastructures based on different communication standards. In the example of FIG. 1, the mast 102 in one region for example supports communications according to the GSM (global system for mobile communications) standard, the mast 104 in another region for example supports communications according to the UMTS (universal mobile telecommunications system) standard, the mast 106 in yet another region for example supports communications according to the WiMax (world interoperability for microwave access) standard, and the mast 108 for example supports communications according to the LTE (Long Term Evolution) standard. It is desirable that the mobile device 100 may communicate via any of the mobile network masts 102 to 108, and thus it is capable of communications according to all of the standards.

Each of the mobile communication standards is for example associated with a different transmission frequency. For example, communications according to the GSM standard may be transmitted at frequencies of 900 MHz or 1.8 GHz, communications according to the UMTS standard at 1.95 GHz, communications according to the WiMax standard at 2.7 or 3.5 GHz, and communications according to the LTE standard at 4.5 GHz. Thus, to be able to support more than one of the above communications standards, the transmission circuitry present in the mobile device 100 should be capable of transmission at any of the associated frequencies.

FIG. 2 illustrates an example of multi-standard transmission circuitry 200 of the mobile device 100. A data signal to be transmitted has been modulated to provide in-phase and quadrature components I and Q. These I and Q data signals are provided to a first transmission branch 201, and in particular to corresponding digital-to-analog converters (DACs) 202 and 204, the outputs of which are in turn coupled to corresponding low pass filters 206 and 208. The outputs from filters 206 and 208 are in turn coupled to corresponding mixers 210 and 212, which perform frequency up conversion of the filtered analog I and Q data signals, by multiplying them with corresponding frequency signals $LO1_I$ and $LO1_Q$ respectively. The outputs of mixers 210 and 212 are combined and provided to a power amplifier 214, which amplifies the signal to provide an RF signal for transmission via an antenna (not illustrated in FIG. 2) of mobile device 100.

Furthermore, the I and Q data signals are provided to a second transmission branch 220, which comprises the same components as the first transmission branch 201, but in which the mixers 210, 212 multiply the filtered digital data signals by frequency signals $LO2_I$ and $LO2_Q$ respectively, different to signals $LO1_I$ and $LO1_Q$.

The transmission branch 201 supports one communications standard, while the transmission branch 220 supports another standard. Thus, the filters 206, 208, carrier frequencies, and power amplifiers 214 of each branch 201, 220 are for example selected based on the particular standard to be supported.

A drawback with the transmission circuitry 200 is that it is costly in terms of silicon area due to the two transmission branches, and the cost is even greater if extended to support more than two standards, by adding additional transmission branches.

SUMMARY OF THE INVENTION

In one aspect, embodiments of the present invention provide for a circuit for multi-standard wireless RF transmission. The circuit includes input circuitry for generating a transmission signal based on an input data signal, and a power amplifier adapted to amplify the transmission signal to provide an output signal for transmission via at least one antenna. The circuit further includes feedback circuitry comprising at least one variable low-pass filter for generating a feedback signal based on the output signal. The input circuitry further comprises pre-distortion circuitry adapted to modify the input data signal based on the feedback signal.

In another aspect, embodiments of the present invention provide for a mobile device comprising a processor block configured to generate a selection signal indicating a selected communications standard for wireless RF transmission, and a transceiver circuit configured to receive said selection signal. The transceiver circuit includes input circuitry for generating a transmission signal based on an input data signal, a power amplifier adapted to amplify said transmission signal to provide an output signal for transmission via at least one antenna, and feedback circuitry comprising at least one variable low-pass filter for generating a feedback signal based on said output signal, wherein said input circuitry further comprises pre-distortion circuitry adapted to modify said input data signal based on said feedback signal.

In yet another aspect, embodiments of the present invention provide for a method of multi-standard wireless RF transmission. The method includes generating, by input circuitry, a transmission signal based on an input data signal, and amplifying said transmission signal by a power amplifier to provide an output signal for transmission via at least one antenna. The method further includes generating, by at least one variable low-pass filter, a feedback signal based on said output signal, and modifying, by pre-distortion circuitry, said input data signal based on said feedback signal.

BRIEF DESCRIPTION OF THE DRAWINGS

The foregoing and other purposes, features, aspects and advantages will become apparent from the following detailed description of embodiments, given by way of illustration and not limitation with reference to the accompanying drawings, in which.

DETAILED DESCRIPTION OF ILLUSTRATIVE EMBODIMENTS

Figure 1:
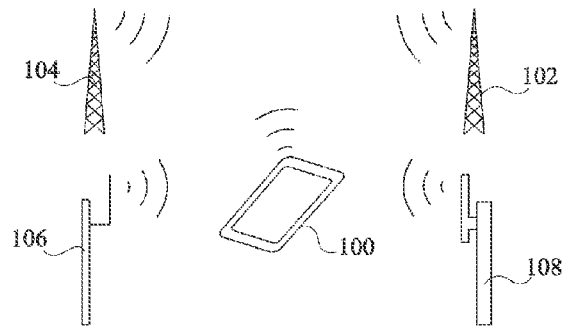
FIG. 1 (described above) illustrates a multi-standard mobile device according to one example.
Figure 2:
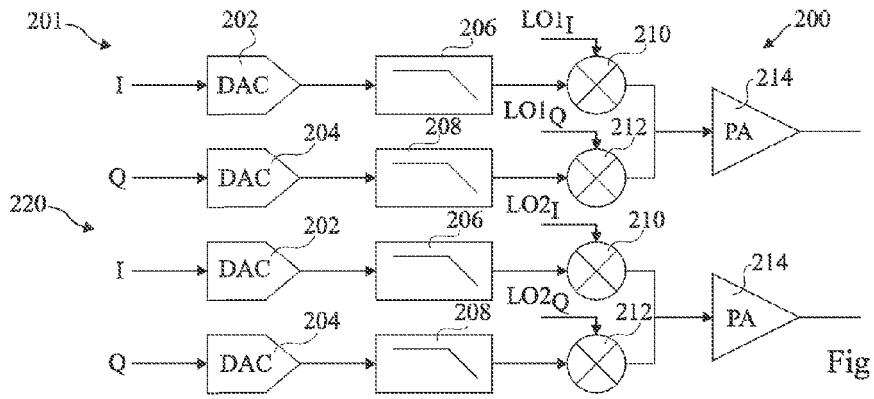
FIG. 2 (described above) illustrates transmission circuitry according to one example.

Before addressing the illustrated embodiments specifically, several embodiments and advantageous thereof will be discussed generally in the following paragraph. Advantageously, these embodiments at least partially address one or more problems in the prior art.

According to an embodiment, there is provided a circuit for multi-standard wireless RF transmission comprising: input circuitry for generating a transmission signal, based on an input data signal; a power amplifier adapted to amplify said transmission signal to provide an output signal for transmission via at least one antenna; and feedback circuitry comprising at least one variable low-pass filter for generating a feedback signal based on said output signal, wherein said input circuitry further comprises pre-distortion circuitry adapted to modify said input data signal based on said feedback signal.

According to one embodiment, the circuit further comprises control circuitry adapted to control a cut-off frequency of said at least one variable low-pass filter based on a selected communications standard for said wireless RF transmission.

According to another embodiment, the circuit further comprises a variable oscillator for generating at least one frequency signal based on a selected communications standard for said wireless RF transmission, and said input circuitry further comprises at least one mixer adapted to perform frequency up conversion of said modified input data signal based on said frequency signal to generate said transmission signal; and said feedback circuitry further comprises at least one mixer adapted to perform frequency down conversion of said transmission signal prior to filtering by said low-pass filter.

According to another embodiment, said at least one variable low-pass filter is a digital filter.

According to another embodiment, said input data signal comprises an in-phase component and a quadrature component.

According to another embodiment, said input circuitry further comprises at least one digital to analog converter for converting said modified input data signal, and said feedback circuitry comprises at least one analog to digital converter for converting said output signal prior to filtering by said low pass filter.

According to another embodiment, said input circuitry further comprises at least one analog variable low-pass filter adapted to filter said modified input data signal.

According to another embodiment, said feedback circuitry further comprises at least one analog low-pass filter of fixed cut-off frequency for filtering said output signal prior to filtering by said variable low-pass filter.

According to another embodiment, said feedback circuitry further comprises an attenuator adapted to attenuate said output signal prior to filtering by said variable low-pass filter.

According to another embodiment, said pre-distortion circuitry further comprises at least one phase shifter for modifying the phase of said feedback signal, and at least one subtracter adapted to subtract said phase modified feedback signal from said input data signal.

According to another embodiment, said at least one variable low-pass filter of said feedback circuitry are FIR filters.

In a further embodiment, there is provided a mobile device comprising: a processor block; and a transceiver circuit comprising the above circuit, wherein said processor block is configured to generate a selection signal indicating a selected communications standard for said wireless RF transmission.

According to one embodiment, the mobile device further comprises at least one antenna arranged to transmit said output signal.

According to yet a further aspect of the present invention, there is provided a method of multi-standard wireless RF transmission comprising: generating, by input circuitry, a transmission signal, based on an input data signal; amplifying said transmission signal by a power amplifier to provide an output signal for transmission via at least one antenna; generating, by at least one variable low-pass filter, a feedback signal based on said output signal; and modifying, by pre-distortion circuitry, said input data signal based on said feedback signal.

According to one embodiment, the method further comprises controlling a cut-off frequency of said at least one variable low-pass filter based on a selected communications standard for said wireless RF transmission.

Figure 3:
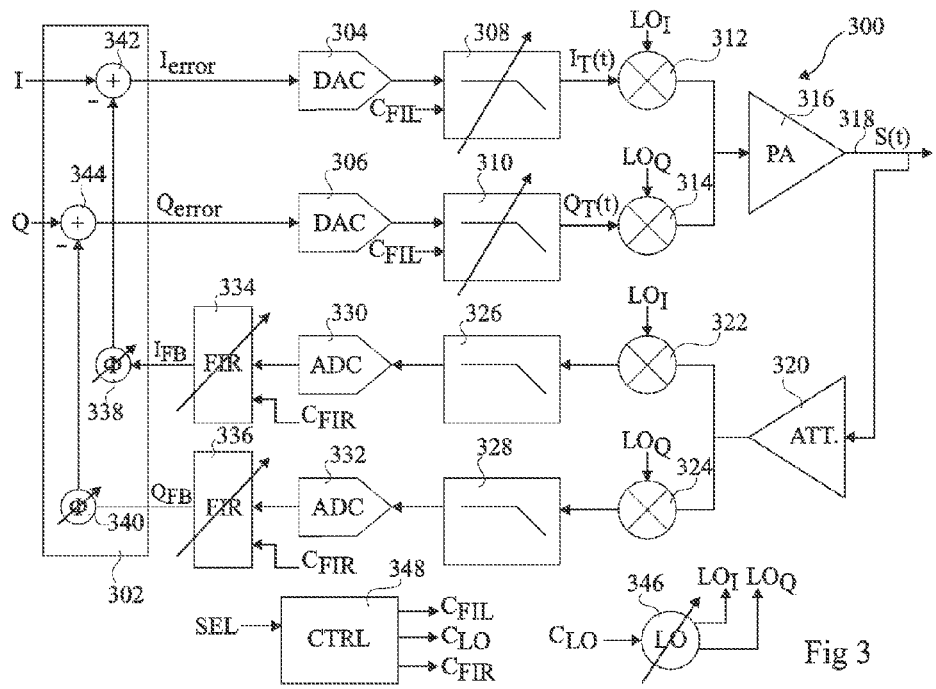
FIG. 3 illustrates transmission circuitry according to an embodiment of the present invention.

Turning now to an illustrated embodiment, FIG. 3 illustrates multi-standard transmission circuitry 300 according to one embodiment. The circuitry 300 is for example implemented in the mobile device 100, allowing data transmission according to two or more different communications standards. For example, some or more of the standards GSM, UMTS, WiMax and LTE are supported.

The circuitry 300 comprises a digital block 302, which receives in-phase and quadrature data signal I and Q. In particular, the I and Q data signals are for example generated by modulating respective sinusoids, which are out of phase with each other by 90°. The modulation used to modulate the I and Q data signals could by any of a number of types. According to the GSM standard, the modulation is for example GMSK (Gaussian minimum shift keying). According to the UMTS standard, the modulation is for example QAM (quadrature amplitude modulation), 16 QAM, PSK (phase shift keying) or more particularly HPSK (hybrid PSK). According to the WiMax standard, the modulation is for example QAM or 16 QAM. According to the LTE standard, the modulation is for example SC (single carrier) modulation for upload and MC (multi-carrier) modulation for download. Alternatively, other types of modulation could be used.

Based on the I and Q data signals, and on a feedback signal discussed in more detail below, the digital circuitry 302 generates error signals $I_{error}$ and $Q_{error}$ provided to respective digital-to-analog converters (DAC) 304, 306. The output of DACs 304, 306 are provided to respective variable low pass filters 308, 310, which filter the analog signals to generate transmission signals $I_T(t)$ and $Q_T(t)$ respectively. In particular, the low pass filters 308, 310 each receive a control signal $C_{FIL}$, controlling their cut-off frequencies, as will be described in more detail below. For example, variable low-pass filters are described in more detail in the IEEE publication entitled "A CMOS Active-RC Low-Pass Filter With Simultaneous Tunable High- and Low-cutoff Frequencies for IEEE 802.22 Applications", H. Shin et al., the contents of which are hereby incorporated by reference to the extent allowable by the law. The outputs of the low pass filters 308, 310 are provided to corresponding mixers 312, 314, which multiply the signals with frequency signals $LO_I$ and $LO_Q$ respectively, to perform frequency up conversion to the transmission frequency range. The frequency signals $LO_I$ and $LO_Q$ are for example sinusoidal signals out of phase with each other by 90°. The outputs of mixers 312, 314 are combined, and coupled to the input of a power amplifier 316, which amplifies the signal to provide an output signal S(t) on a line 318 for transmission via one or more antennas (not illustrated in FIG. 3). For example, the gain of the power amplifier is of between 10 and 20 dB.

A feedback signal is taken from the output line 318, and provided to an attenuator 320, which reduces the signal, for example by between 3 and 6 dB. The output of attenuator 320 is provided to mixers 322 and 324, which multiply the attenuated signal by the frequency signals $LO_I$ and $LO_Q$ respectively to perform frequency down conversion. The outputs of mixers 322 and 324 are provided to low pass filters 326 and 328 respectively, which are for example first order filters having a fixed cut-off frequency, as will be described in more detail below. The outputs from filters 326, 328 are provided to analog-to-digital converters (ADCs) 330, 332 respectively, to generate digital signals. These digital signals are filtered by variable FIR (Finite Impulse Response) respective filters 334, 336, to provide digital feedback signals $I_{FB}$ and $Q_{FB}$ respectively. In particular, the filters 334, 336 for example comprise a number of taps each associated with a corresponding filter coefficient, and an input for receiving a control signal $C_{FIR}$ for adjusting one or more of these coefficients in order to vary the cut-off frequency of the filters. For example, such variable FIR filters are described in more detail in the publication entitled "GUI Based Decimation Filter Design Tool for Multi-Standard Wireless Transceivers", by T. K. Shahanna et al., the contents of which are hereby incorporated by reference to the extent allowable by the law. The outputs of the variable FIR filters 334, 336 are coupled to corresponding inputs of the digital block 302.

The digital block 302 for example comprises phase shifters 338, 340, which apply a variable phase rotation to the feedback signals $I_{FB}$, $Q_{FB}$, before providing these signals to subtracters 342, 344 respectively, which subtract the feedback signals $I_{FB}$, $Q_{FB}$ from the I and Q signals respectively, in order to generate the error signals $I_{error}$ and $Q_{error}$.

The frequency signal $LO_I$ provided to the mixers 312, 322, and the frequency signal $LO_Q$ provided to the mixers 314, 324 are for example supplied by a variable local oscillator 346, based on a control signal Cu) to the variable local oscillator 346. For example, the variable local oscillator is a VCO (voltage controlled oscillator). Such oscillators are for example described in more detail in the IEEE publication entitled "A 2.6 GHz/5.2 GHz CMOS Voltage-controlled Oscillator", C. Lam et al., and in the IEEE publication entitled "Multi-band Multi-standard Local Oscillator Generation for Direct up/down Conversion Transceiver Architectures Supporting WiFi and WiMax Bands in Standard 45 nm CMOS Process", R. Sadhwani et al., the contents of both publications being incorporated herein by reference to the extent allowable by the law.

A control block 348 receives a selection signal SEL, indicating a communications standard to be used for the transmission of the data signals. The selection signal SEL is for example provided by the baseband processor of the mobile device 100. Based on the selection signal SEL, the control block 348 generates control signals $C_{FIL}$, $C_{LO}$ and $C_{FIR}$ for controlling the filters 308, 310, the variable local oscillator 346 and the variable FIR filters 334, 336 respectively. For example, the control circuitry 348 comprises a memory storing the optimal control parameters for each of the supported standards.

Thus in operation, depending on the selected communications standard, the filters 308, 310 are chosen to have appropriate cut-off frequencies, which for example depend on the data rate of the data signals according to the selected communications standard. Furthermore, the frequencies of the frequency signals $LO_I$ and $LO_Q$ are adapted based on the selected communications standard. Additionally, the cut-off frequencies of the variable FIR filters 334, 336 are chosen, depending on the main and adjacent channel components of the transmission signal according to the selected communications standard.

The characteristics, such as the gain, of the power amplifier 316 are for example not changed based on the selected communications standard. Instead, the feedback path provided by attenuator 320 through to the variable FIR filters 334, 336 provide predistortion to the input data signals, thereby improving linearity of the output signal without any variation being applied to the power amplifier.

The power amplifier 316 and/or mixers 312, 314, are for example chosen to have relatively high gain over a large bandwidth, and in particular a relatively high gain for all of the frequency ranges that may be present when each of the communications standards is applied.

The mixers 312, 314, 322, 324 and the low pass filters 308, 310, 326 and 328 are for example implemented by passive devices, and therefore they consume relatively little energy.

Figure 4:
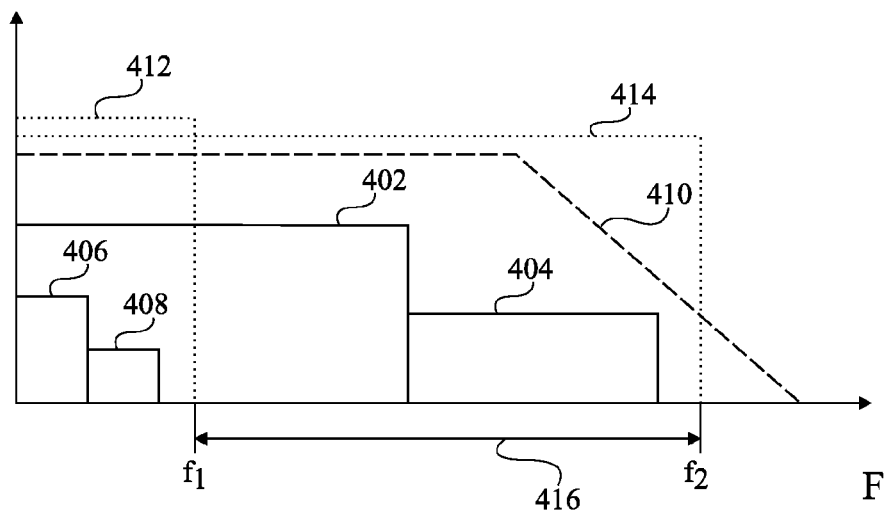
FIG. 4 is a graph showing characteristics of filters of FIG. 3 according to an embodiment of the present invention.

FIG. 4 illustrates an example of frequencies present in the feedback path of FIG. 3. The signal components 402 and 404 represent the main and adjacent channel parts of the output signal on line 318 according to one example in which the signals for example correspond to the LTE standard. The signal components 406 and 408 represent the main and adjacent channel parts of the output signal on line 318 according to another example in which the signals for example correspond to the GSM standard.

An example of the characteristics of the low pass filters 326 and 328 is shown by the dashed line 410 in FIG. 4, and the cut-off frequency of these filters is chosen to encapsulate the main and adjacent channels of all of the signal components 402 to 408 of the two examples of communications standards.

One example of the characteristics of the variable FIR filters 334, 336 is shown by dotted line 412, according to which a cut-off frequency $f_1$ is chosen slightly higher than the highest frequency of the high sideband component 408. Another example of the characteristics of the variable FIR filters 334, 336 is shown by dotted line 414, according to which a cut-off frequency $f_2$ is chosen slightly higher than the highest frequency of the high sideband component 404. Thus, the cut-off frequency of the FIR filter is for example variable in a range between the frequencies $f_1$ and $f_2$, as represented by arrow 416.

In one example, assuming the frequency of the main channel component 406 is in the order of 100 kHz, the associated cut-off frequency $f_1$ of the variable FIR filters 334, 336 is in the region of 140 kHz, thereby including the adjacent channel 408. Assuming the frequency of the main channel component 402 is in the order of 10 MHz, the associated cut-off frequency $f_2$ of the variable FIR filters 334, 336 is in the region of 15 MHz, thereby including the adjacent channel 404.

Figure 5:
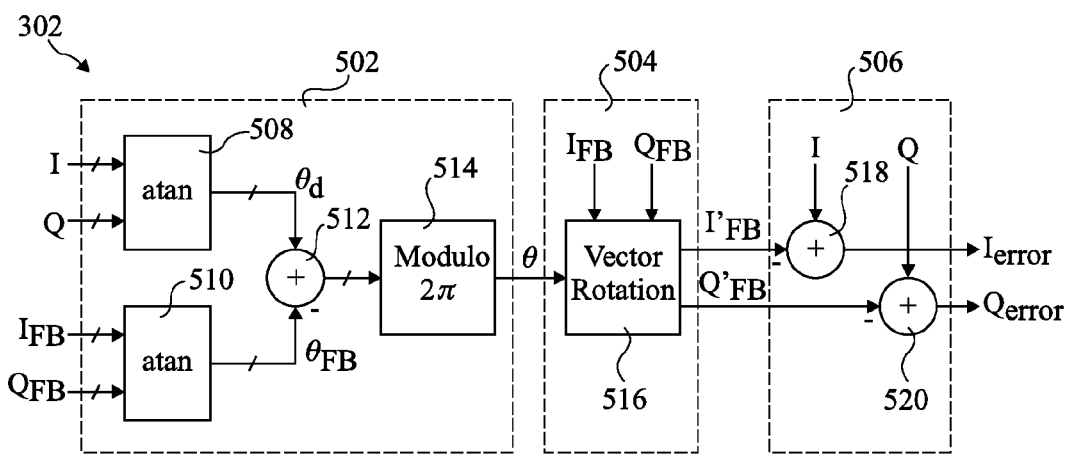
FIG. 5 illustrates a digital portion of the circuitry of FIG. 3 in more detail according to an embodiment of the present invention.

FIG. 5 illustrates the digital block 302 of FIG. 3 in more detail according to one example. As illustrated, the digital portion comprises three main modules, a phase detection module 502, a phase rotation module 504 and a subtraction module 506.

The phase detection module 502 for example comprises an atan function block 508, which receives the I and Q input data signals, and an atan function block 510, which receives the feedback signals $I_{FB}$ and $Q_{FB}$ from the FIR filters 334, 336 of FIG. 3. The atan function of blocks 508, 510 is for example implemented by a lookup table, or by a CORDIC (coordinate rotation digital computer) algorithm. In the case of a lookup table, the signal I is for example divided by the signal Q, or vice versa, and the result provides the input to the lookup table. The lookup table is for example in the form of an interpolation table, storing values of the atan function. Alternatively, in the case of a CORDIC solution, an iterative algorithm is implemented which takes as an input the two coordinates of the vector of the I or Q signal, and outputs the corresponding phase.

The phase values $\theta_d$ and $\theta_{FB}$ generated by the atan function blocks 508, 510 respectively are provided to a subtracter 512, which subtracts the phase $\theta_{FB}$ from phase $\theta_d$. The output of subtracter 512 is for example coupled to a modulo $2\pi$ block 514, which standardizes the output of the subtracter 512 to prevent overflow, and to provide a signal $\theta$ suitable for the phase rotation module 504. The phase rotation module 504 comprises a vector rotation block 516, which receives the phase value $\theta$ from block 502, along with the feedback signals $I_{FB}$ and $Q_{FB}$, and modifies the phase of the feedback signals based on the phase value $\theta$. For example, the phase rotation module 504 applies the following equation:

$$\begin{bmatrix} I'_{FB} \\ Q'_{FB} \end{bmatrix} = \begin{bmatrix} \cos(\theta) & -\sin(\theta) \\ \sin(\theta) & \cos(\theta) \end{bmatrix} \begin{bmatrix} I_{FB} \\ Q_{FB} \end{bmatrix}$$

where $I_{FB}'$ and $Q_{FB}'$ are the phase modified feedback values, and $\theta$ is the phase value provided by phase estimation module 502. This equation could for example be implemented using lookup tables and complex multiplication. Alternatively, the phase rotation could be implemented by a CORDIC algorithm without the use of multipliers.

The phase adjusted feedback signals $I_{FB}'$ and $Q_{FB}'$ are provided to the subtraction block 506, and in particular to subtracters 518 and 520 respectively, which subtract these feedback signals from the signals I and Q, to provide the error signals $I_{error}$ and $Q_{error}$. It will be apparent to those skilled in the art that all the subtracters described herein may in practise be implemented by generating the two's complement of the values to be subtracted, and then by performing an addition.

Figure 6:
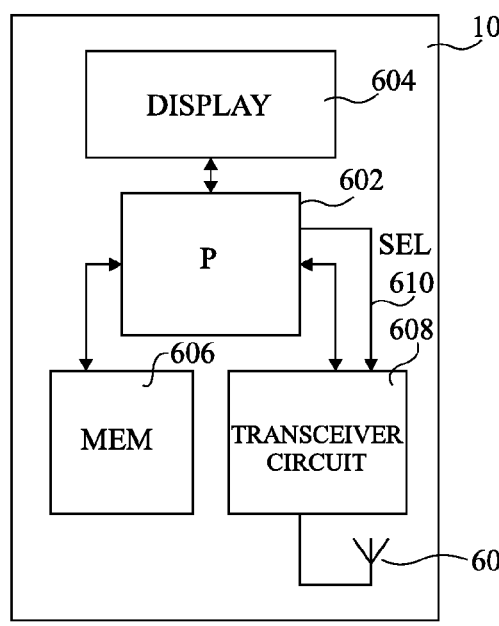
FIG. 6 illustrates a mobile device according to an embodiment of the present invention.

FIG. 6 illustrates the mobile device 100 of FIG. 1 in more detail according to one embodiment, in which it comprises a processing block P 602, which is for example the baseband processor of the mobile device, and communicates with a number of components, such as a display 604, a memory 606, and transceiver circuit 608. The transceiver circuit 608 for example comprises the transmission circuitry of FIG. 3, and also an antenna 609 for transmitting the output signal. Furthermore, the transceiver circuit 608 for example receives a selection signal SEL on a line 610 from the processor 602, indicating via which of the supported communications standards the data is to be transmitted. For example, the user of the mobile device 100 may opt to change the communications standard, for example to economize battery usage. For example, via the user interface of the mobile device 100, the user selects the communications standard to be applied. Alternatively, the base station to which the mobile device 100 is connected may select the mode of communications, for example based on various factors such whether or not any of the communications standards is overloaded.

The mobile device 100 is for example a mobile telephone, smartphone, laptop or tablet computer, portable games console, digital camera, or other electronics device capable of wireless communications according to a plurality of communications standards.

Having thus described at least one illustrative embodiment of the invention, various alterations, modifications and improvements will readily occur to those skilled in the art.

For example, while the GSM, UMTS, WiMax and LTE communications standards have been provided by way of example, it will be apparent to those skilled in the art that the transmission circuitry 300 of FIG. 3 could support any combination of these standards, and/or other standards such as the Wifi (wireless fidelity) standard, or the Bluetooth standard.

Furthermore, while the example of variable FIR filters 334, 336 have been described in relation to FIG. 3, it will be apparent to those skilled in the art that in alternative embodiments, other types of digital low pass filters could be used. An advantage of implementing these filters as digital filters is that a precise filtering function can be achieved.

Furthermore, it will be apparent to those skilled in the art that, while the components of the block 302 of FIG. 3 have been described as being implemented in digital, in alternative embodiments one or more of the functions of this block could be implement by analog components, and vice versa for the analog filters 308, 310 and 326, 328.

What is claimed is:

1. A mobile device comprising:
   a processor block configured to generate a selection signal indicating a selected communications standard for wireless radio frequency (RF) transmission; and
   a transceiver circuit configured to receive said selection signal and comprising:
   input circuitry for generating a transmission signal based on an input data signal, wherein said input circuitry comprises at least one analog variable low-pass filter adapted to filter said input data signal;
   a power amplifier adapted to amplify said transmission signal to provide an output signal;
   feedback circuitry comprising at least one digital variable low-pass filter for generating a feedback signal based on said output signal, wherein said input circuitry further comprises pre-distortion circuitry adapted to modify said input data signal based on said feedback signal;
   a variable oscillator configured to generate at least one frequency signal, the input circuitry being configured to perform frequency up conversion of a signal at the output of the at least one analog variable low-pass filter based on the at least one frequency signal, the feedback circuitry being configured to perform a frequency down conversion of a signal at the input of the at least one digital variable low-pass filter based on the at least one frequency signal; and
   a controller configured to receive the selection signal and generate a first control signal, a second control signal, and a third control signal based on the selection signal, the first control signal being configured to control a first variable cut-off frequency of the at least one analog variable low-pass filter, the second control signal being configured to control a second variable cut-off frequency of the at least one digital variable low-pass filter, the at least one frequency signal being generated by the variable oscillator based on the third control signal.

2. The mobile device of claim 1, further comprising at least one antenna arranged to transmit said output signal.

3. The mobile device of claim 1 further comprising a display and a memory, respectively coupled to the processor block.

4. The mobile device of claim 1 wherein the selected communications standard includes at least one of GSM (global system for mobile communications), UMTS (universal mobile telecommunications system) standard, WiMax (world interoperability for microwave access) standard, LTE (Long Term Evolution), Wifi (wireless fidelity) standard, and Bluetooth standard.

5. A method of multi-standard wireless radio frequency (RF) transmission comprising:
generating a transmission signal based on an input data signal;
generating, by a controller, a first control signal, a second control signal, and a third control signal;
generating, by a variable oscillator, at least one frequency signal based on the third control signal;
filtering said transmission signal, by at least one analog variable low-pass filter, to provide a filtered transmission signal, the at least one analog variable low-pass filter having a first variable cut-off frequency based on the first control signal;
frequency up converting said filtered transmission signal based on the at least one frequency signal to provide a converted filtered transmission signal;
amplifying said converted filtered transmission signal, by a power amplifier, to provide an output signal for transmission via at least one antenna;
frequency down converting said output signal based on the at least one frequency signal to provide a feedback signal;
filtering said feedback signal, by at least one digital variable low-pass filter, to provide a filtered feedback signal, the at least one digital variable low-pass filter having a second variable cut-off frequency based on the second control signal; and
pre-distorting said input data signal based on said filtered feedback signal.

6. The method of claim 5, further comprising controlling the second variable cut-off frequency of said at least one digital variable low-pass filter based on a selected communications standard for said wireless RF transmission.

7. The method of claim 5, further comprising generating, by a processor block, a selection signal to input into the controller, the first control signal, the second control signal, and the third control signal being based on the selection signal.

8. The method of claim 7, further comprising adjusting at least one coefficient of said at least one digital variable low-pass filter to adjust the second variable cut-off frequency.

9. The method of claim 5 further comprising attenuating the output signal to provide an attenuated signal, the frequency down converting the attenuating signal to provide the feedback signal, converting the feedback signal to a digital signal, and comparing a phase of the digital feedback signal to a phase of the input data signal.

10. A circuit comprising:
input circuitry having a first input and a second input, the first input coupled to an input data signal;
a digital-to-analog converter coupled to an output of the input circuitry;
an analog variable low-pass filter coupled to an output of the digital-to-analog converter;
an up-converting mixer coupled to an output of the analog variable low-pass filter;
a power amplifier coupled to an output of the up-converting mixer, the power amplifier configured to provide an output signal;
at least one antenna coupled to the output signal;
an attenuator coupled to the output signal;
a down-converting mixer coupled to the output of the attenuator;
an analog fixed low-pass filter coupled to an output of the down-converting mixer;
an analog-to-digital converter coupled to an output of the analog fixed low-pass filter;
a digital variable low-pass filter coupled to an output of the analog-to-digital converter, the digital variable low-pass filter configured to provide a feedback signal to the second input of the input circuitry, the input circuitry further comprising:
a phase shifter coupled to the second input of the input circuitry; and
a subtracter having a first input coupled to the input data signal and a second input coupled to an output of the phase shifter, the output of the subtracter coupled to the output of the input circuitry;
a variable oscillator configured to generate at least one frequency signal, the up-converting mixer being configured to perform frequency up conversion of a signal at the output of the analog variable low-pass filter based on the at least one frequency signal, the down-converting mixer being configured to perform a frequency down conversion of a signal at the output of the attenuator based on the at least one frequency signal; and
a controller configured to generate a first control signal, a second control signal, and a third control signal, the first control signal being configured to control a first variable cut-off frequency of the analog variable low-pass filter, the second control signal being configured to control a second variable cut-off frequency of the digital variable low-pass filter, the least one frequency signal being generated by the variable oscillator based on the third control signal.

11. The circuit of claim 10, wherein the digital variable low-pass filter is a finite impulse response (FIR) filter.

12. The circuit of claim 10 further comprising:
a processor configured to generate a selection signal indicating a selected communications standard for wireless radio frequency (RF) transmission, the controller being further configured to generate the first control signal, the second control signal, and the third control signal based on the selection signal.

13. A circuit for multi-standard wireless radio frequency (RF) transmission comprising:
input circuitry for generating a transmission signal based on an input data signal, wherein said input circuitry comprises at least one analog variable low-pass filter with a first variable cut-off frequency;
a power amplifier adapted to amplify said transmission signal to provide an output signal for transmission via at least one antenna;
feedback circuitry comprising at least one digital variable low-pass filter with a second variable cut-off frequency for generating a feedback signal based on said output signal, wherein said input circuitry further comprises pre-distortion circuitry adapted to modify said input data signal based on said feedback signal, wherein said feedback signal at the pre-distortion circuitry is based on said output signal from 0 Hz to said variable cut-off frequency;
a variable oscillator configured to generate at least one frequency signal, the input circuitry being configured to perform frequency up conversion of a signal at the output of the at least one analog variable low-pass filter based on the at least one frequency signal, the feedback circuitry being configured to perform a frequency down conversion of a signal at the input of the at least one digital variable low-pass filter based on the at least one frequency signal; and a controller configured to generate a first control signal, a second control signal, and a third control signal, the first control signal being configured to control the first variable cut-off frequency of the at least one analog variable low-pass filter, the second control signal being configured to control the second variable cut-off frequency of the at least one digital variable low-pass filter, the at least one frequency signal being generated by the variable oscillator based on the third control signal.

14. The circuit of claim 13, further comprising:

control circuitry adapted to control the first variable cut-off frequency and the second variable cut-off frequency based on a selected communications standard for said wireless RF transmission.

15. The circuit of claim 13, wherein said input data signal comprises an in-phase component and a quadrature component.

16. The circuit of claim 13, wherein said input circuitry further comprises at least one digital to analog to converter for converting said modified input data signal, and wherein said feedback circuitry comprises at least one analog to digital converter for converting said output signal prior to filtering by said at least one digital variable low pass filter.

17. The circuit of claim 13, wherein said feedback circuitry further comprises at least one analog low-pass filter of fixed cut-off frequency for filtering said output signal prior to filtering by said at least one digital variable low-pass filter.

18. The circuit of claim 13, wherein said feedback circuitry further comprises an attenuator adapted to attenuate said output signal prior to filtering by said at least one digital variable low-pass filter.

19. The circuit of claim 13, wherein said pre-distortion circuitry further comprises at least one phase shifter for modifying the phase of said feedback signal, and at least one subtracter adapted to subtract said phase modified feedback signal from said input data signal.

20. The circuit of claim 13, wherein said at least one digital variable low-pass filter of said feedback circuitry is an FIR (finite impulse response) filters.

* * * * *